United States Patent Office 3,686,130

Patented Aug. 22, 1972

3,686,130

TERNARY AZEOTROPIC COMPOSITIONS

Oliver A. Barton, Florham Park, N.J., and Kevin P. Murphy, Orchard Park, N.Y., assignors to Allied Chemical Corporation, New York, N.Y.

No Drawing. Filed Sept. 10, 1970, Ser. No. 71,243

Int. Cl. C11d 7/50; C23g 5/02

U.S. Cl. 252—171 1 Claim

ABSTRACT OF THE DISCLOSURE

Tetrachlorodifluoroethane (sym-, asym-, and mixtures thereof), secondary butanol and nitromethane form ternary azeotropic mixtures which are constant boiling. These azeotropes are useful as solvents for cleaning printed circuit boards and the like.

BACKGROUND OF THE INVENTION

The use of printed circuit boards, such as those used in television receivers, copying machines, computers, missile guidance systems and the like, has become increasingly important in recent years. In the manufacture of such printed circuits, certain areas of the board are covered with photosensitive resists. These resists are generally thin coatings produced from organic resins which, when exposed to radiation of predetermined wavelength, are polymerized and/or cross-linked so as to be converted to polymers which possess altered solubility characteristics. Two type of resists are available, negative acting and positive acting. The former, after exposure to polymerizing radiation, remains insoluble in the developed solvent, while the latter is soluble in the developer solvent. In both instances, the resist pattern which remains after development, i.e. after removal or "stripping" of unprinted portions of the resist material, is chemically resistant to the etching solutions that are used in the succeeding steps of the production of the printed circuit boards.

It is necessary that the solvent used to remove the unwanted excess of the resist, and, when desired, the resist itself following completion of the printed circuit, does not affect the circuit board itself, or the complex circuitry printed therein.

The ideal solvent for this purpose would be relatively low boiling, non-toxic and possess a selective solvent power such as to dissolve the resist composition and associated contaminants but insufficient to attack, such as by discoloring or swelling the diverse materials making up the circuit boards.

Halogenated hydrocarbons including fluorocarbons, such as trichlorotrifluoroethane and tetrachlorodifluoroethane, have been used in various solvent applications. While effective for removing waxes and greases these solvents are relatively high boiling and do not dissolve many polymeric substances.

It is general practice to utilize mixtures of solvents to achieve the desired solvency but these have the additional disadvantage in that they are not constant boiling and preferential evaporation of the more volatile component of such mixtures results in mixtures of altered compositions which may have less desirable properties, such as lower solvency for the photoresist resins, lesser inertness towards the components of the circuit boards, and increased flammability.

For example a mixture of methylene chloride, trichloroethane, tetrahydrofuran and isopropanol is highly effective for removal of photoresist resins but causes severe whitening of the circuit board even at ambient temperature on exposures of two minutes or more. Such a mixture is not constant boiling and tends to fractionate, i.e. lose one or more of the more volatile components during use.

A number of binary azeotropic mixtures (constant boiling) have been employed for cleaning electrical boards which afford many advantages obtainable with solvent mixtures but which do not suffer from the above described disadvantages of non-constant boiling solvent mixtures. Illustrative of such binary azeotropic mixtures are the azeotrope of 1,1,2-trichloro-1,2,2-trifluoroethane and methylene chloride, B.P. 37° C./760 mm. (U.S. Pat. 2,999,817) the azeotrope of 1,1,2-trichloro-1,2,2-trifluoroethane and methyl alcohol, B.P. 39° C./760 mm. (U.S. Pat. 2,999,816) and the azeotropes of 1,1,2-trichloro-1,2,2-trifluoroethane and trans 1,2-dichloroethylene (U.S. Pat. 3,455,835). Unfortunately while such azeotropes are effective solvents for the rosin solder fluxes used in the preparation of the printed circuits, they are ineffective to remove the photoresist resins, or attack the circuit boards or the components thereof, or leave deposits on the boards.

Most of the non-constant boiling solvent mixtures currently in use for removal of photoresist resins from electronic circuit boards are used at ambient temperature. The treated boards on removal from the solvent mixture must be dried. Such a drying step results not only in a longer cycle period but also in a loss of solvent. Furthermore, the necessity to provide drying equipment and/or space increases the cost of overall operation.

It is, therefore, a principal object of this invention to provide novel solvent compositions for photoresist resins normally encountered on printed circuit boards which novel solvent compositions exhibit a higher degree of solvency for such photoresist resins.

Another object of this invention is to provide novel solvent compositions for photoresist resins which arre constant boiling or essentially constant boiling.

Still another object of this invention is to provide solvent compositions for photoresist resins used in printed circuit boards which combine the properties of high solvency, non-flammability, and inertness to electronic components.

It is a particular object of the invention to provide essentially constant boiling mixtures possessing the non-flammability and stability characteristics of tetrachlorodifluoroethane but which exhibit significantly greater solvency properties toward photoresist resins which are normally used on printed circuit boards.

SUMMARY OF THE INVENTION

The present invention is directed to constant boiling compositions, and particularly to novel ternary azeotropic compositions, which possess enhanced solvency for polymeric compounds, particularly photoresist coatings used in the manufacture of printed circuit boards. The novel ternary azeotropic compositions are constant boiling mixtures which contain about 77 weight percent of tetrachlorodifluoroethane, about 7 weight percent of secondary butanol and about 16 weight percent of nitromethane. In particular, the invention is directed to the ternary azeotrope of tetrachlorodifluoroethane, secondary butanol and nitromethane, having a minimum boiling point of 80.65° C. at 760 mm. pressure and having the composition of

| | Weight percent |
|---|---|
| Tetrachlorodifluoroethane | 77.3 |
| Sec. butanol | 7.2 |
| Nitromethane | 15.5 |

Such compositions are effective solvents for removal of polymerized photoresist compositions from printed circuit boards without attacking or dissolving of epoxy or phenolic adhesives used in the manufacture of the base structures of the circuit board sandwiches.

The tetrachlorodifluoroethane component is available commercially. This material, as sold commercially, is a mixture of the symmetrical isomer, 1,1,2,2,tetrachloro-1,2-difluoroethane, and the asymmetrical isomer, 1,1,1,2-tetrachloro-2,2-difluoroethane, in the ratio of approximately 69 mol percent and 31 mol percent, respectively. We have found that either the pure isomers or mixtures thereof form minimum boiling azeotropes with secondary butanol and nitromethane having approximately the same composition, boiling point, and properties. Accordingly our invention includes the ternary azeotrope derived from either the symmetrical or asymmertical tetrachlorodifluoroethane or mixtures thereof. Further reference in this specification and the claims appended hereto, unless otherwise indicated, to "tetrachlorodifluoroethane" is intended to include the pure isomers and/or any mixtures thereof.

In the following examples parts and percentages are by weight and temperatures are given in degrees centigrade, unless otherwise specified.

EXAMPLE 1

Preparation of ternary azeotrope (A) A mixture of equimolecular proportions of tetrachlorodifluoroethane (the commercial mixture of the isomers, B.P. 92.8°), sec.-butanol (B.P. 99.5°), and nitromethane (B.P. 101.5°), was charged to a still and heated therein to reflux. The mass was then distilled. A constant boiling fraction at about 80° was collected and found to contain all three components. This fraction was redistilled and analyzed by gas chromatography. The composition of the azeortrope was found to be:

| | Percent |
|---|---|
| Tetrachlorodifluoroethane | 77.3 |
| Sec.-butanol | 7.2 |
| Nitromethane | 15.5 |

The boiling point of this azeotrope was 80.65° at 760 mm. pressure.

(B) The procedure of part A above was repeated using in place of the commercially available mixture of tetrachlorodifluoroethane isomers an equivalent amount of the pure (97 mol percent) asymmetrical isomer. A ternary azeotrope of essentially the same percentage composition was obtained. The boiling point of this azeotrope was 81.3° at 760 mm. pressure.

(C) The procedure of part A above was repeated using in place of the mixture of tetrachlorodifluoroethane isomers, an equivalent amount of the pure (99 mol percent) symmetrical isomer. A ternary azeotrope of essentially the same percentage composition was obtained. The boiling point of this azeotrope was 80.7° at 760 mm. pressure.

EXAMPLE 2

In order to demonstrate the effectiveness of the azeotropes of our invention as solvents for polymer coatings on printed circuit boards and that such solvents do not have any significant whitening or solvating effect on the boards, the following tests were made:

Two boards suitable for use in the manufacture of printed circuit boards, were coated with a commercially available photoresist, Riston 13 (TM of E. I. du Pont de Nemours). Riston is a commercially available photopolymer film resist product consisting of a three layer sandwich of 0.001 in. transparent polyester film and polyethylene film with a pre-dyed, presensitized negative resist in between.

The circuit boards were coated by first removing the polyethylene film, then laminating the resist to the cleaned surface of the board. The boards were exposed to ultraviolet radiation through a glass plate having thereon a reproduction of the circuit to polymerize selected areas of the coated boards. Thereafter the polyester films were removed and the unpolymerized portions of the resist were removed by washing with trichloroethane. One of the washed boards was dried by heating in a moderate oven ("baked") to remove residual trichloroethane and another was further treated without "baking." Both boards were then treated with the stripping solvent to remove polymerized photoresist resin covering the printed circuit. The efficiency of the "stripping" and the effect of the solvent on the boards were determined by visual observation of the stripped boards, these data are also included in the table below.

TABLE I

| Item | Azeotrope of Example 1A | |
|---|---|---|
| | Unbaked Riston 13 | Baked Riston 13 |
| Temperature | 80.6 degrees | 80.6 degrees. |
| Time of contact | 15 seconds | 15 seconds. |
| Extent of removal of resist coating | Complete | Complete. |
| Effect on board | None | None. |

It can be seen from these data that the novel stripping agent was effective as a solvent to completely remove the photoresist coating (both "baked" and "unbaked"), and did not noticeably affect the coated boards.

Moreover, the stripping of the photoresist resin was effected by the azeotrope of the invention at the boiling point thereof. The stripped boards, after removal from the treatment bath, dried rapidly and completely.

The azeotrope being constant boiling, could be efficiently handled at the temperature of the bath without loss of one or more components of the solvent mixture (i.e. it did not fractionate). Proprietary solvent mixtures, because of losses of one or more of the components of the solvent mixture by evaporation during use, could not be reclaimed intact by conventional rectification.

The novel azeotropes of the invention find other solvent applications such as for removing gases and oils from a variety of industrial items, for the cleaning of photographic films and prints, for the removal of buffing compounds, such as rouge, and also may be used as heat exchange media, electrical transfer media, chemical reaction media, and as hydraulic fluids.

It will be apparent to those skilled in the art that for specialized purposes, various additives could be incorporated with the novel solvent mixtures of the invention, for example, lubricants, detergents, and the like. These additives are chosen so as not to adversely alter the essential properties of the mixture for a given application.

The invention is not intended to be limited by any specific embodiments disclosed herein but only by the scope of the following claim.

We claim:

1. A ternary azeotrope composition consisting essentially of about 77.3 weight percent of tetrachlorodifluoroethane, about 7.3 weight percent of sec. butanol and about 15.5 weight percent of nitromethane, said mixture boiling at about 80.65° C. at 760 mm. pressure.

References Cited

UNITED STATES PATENTS 3,085,116 4/1963 Kualnes 252—171
3,445,527 5/1969 Okamura 260—652.5

LEON D. ROSDOL, Primary Examiner
W. E. SCHULZ, Assistant Examiner

U.S. Cl. X.R.

252—66; 260—652.5

PO-1050
(5/69)

UNITED STATES PATENT OFFICE
CERTIFICATE OF CORRECTION

Patent No. 3,686,130 Dated August 22, 1972

Inventor(s) Oliver A. Barton and Kevin P. Murphy

It is certified that error appears in the above-identified patent and that said Letters Patent are hereby corrected as shown below:

Col. 2, Line 36 "in" should be -- on --;

Col. 4, Line 56 "7.3" should be -- 7.2 --;

Col. 4, Line 58 "at 760 mm." should read -- at about 760 mm. --

Signed and sealed this 6th day of March 1973.

(SEAL)
Attest:

EDWARD M.FLETCHER,JR.
Attesting Officer

ROBERT GOTTSCHALK
Commissioner of Patents